United States Patent [19]
Maudie et al.

[11] Patent Number: 5,889,211
[45] Date of Patent: Mar. 30, 1999

[54] MEDIA COMPATIBLE MICROSENSOR STRUCTURE AND METHODS OF MANUFACTURING AND USING THE SAME

[75] Inventors: Theresa A. Maudie, Phoenix; David J. Monk, Mesa; Timothy S. Savage, Scottsdale, all of Ariz.

[73] Assignee: Motorola, Inc., Schaumburg, Ill.

[21] Appl. No.: 415,900

[22] Filed: Apr. 3, 1995

[51] Int. Cl.⁶ ..................................................... G01L 9/04
[52] U.S. Cl. ........................... 73/720; 73/706; 29/407.08
[58] Field of Search ............................. 73/706, 715, 717, 73/720; 29/407.08

[56] References Cited

U.S. PATENT DOCUMENTS

| | | | |
|---|---|---|---|
| 4,655,088 | 4/1987 | Adams | 73/756 |
| 4,732,042 | 3/1988 | Adams | 73/706 |
| 4,773,269 | 9/1988 | Knecht et al. | 73/706 |
| 4,790,192 | 12/1988 | Knecht et al. | 73/721 |
| 5,076,147 | 12/1991 | Hegner et al. | 92/103 SD |
| 5,165,282 | 11/1992 | Nakamura et al. | |
| 5,335,549 | 8/1994 | Kato | 73/706 |

FOREIGN PATENT DOCUMENTS 0548470  6/1993  European Pat. Off. .

OTHER PUBLICATIONS

L.E. Gates, Hughes Aircraft Company, Radar Systems Group, Sealed Chip–On–Board, Sep. 1994, pp. 48–50.

Ljubisa Ristic, Sensor Technology and Devices, 1994 Artech House, Inc., pp. 227–229.

Robert C. Byrne, National Semiconductor Corp., Robert C. Camillerri, Dow Corning Corporation, Reliability Without Hermeticity (RWOH) for Integrated Circuits: Sealed Chips for Hermetic–Like Protection, 1993 Government Microcircuit Applications Conference (GOMAC).

L.E. Gates et al., Hughes Aircraft Company, Ionic Systems, Hermetic Passivation of Chip–on–Board Circuits, 1991, pp. 813–819.

Pending U.S. Patent Application Serial No.: 08/367,603; Entitled: "Flow Sensor Device and Method"; Inventor: Vijay Sarihan; Assignee: Motorola, Inc.; File Date: 01/03/95.

*Primary Examiner*—George Dombroske
*Assistant Examiner*—Paul D. Amrozowicz
*Attorney, Agent, or Firm*—Kevin B. Jackson

[57] ABSTRACT

A media compatible microsensor structure (11) for sensing an environmental condition in a harsh media includes an inorganic protective film (17) covering portions of the structure that will be exposed to the harsh media. In one embodiment, the microsensor structure (11) includes a microsensor package (12), a microsensor device (16) bonded to the microsensor package (12), a leadframe (13), a connective wire (14) connecting the microsensor device (16) to the leadframe (13), and an inorganic protective film (17) formed on all or portion of the exposed surfaces of the structure.

14 Claims, 5 Drawing Sheets

MEDIA COMPATIBLE MICROSENSOR STRUCTURE AND METHODS OF MANUFACTURING AND USING THE SAME

BACKGROUND OF THE INVENTION

This invention relates, in general, to microsensor devices, and in particular, to structures and methods for protecting microsensor devices exposed to harsh environments.

Microsensor devices are well known and have become key elements in process control and analytical measurement systems. Microsensor devices are used in many applications including industrial monitoring, factory automation, the automotive industry, transportation, telecommunications, computers and robotics, environmental monitoring, health care, and household appliances. Increasingly, microsensor devices are called upon to function reliably in harsh media including strong chemicals (e.g., polar and non-polar solvents, acid solutions, and alkaline solutions), extreme temperatures, and extreme pressures. Unless properly protected, these harsh environments can degrade or destroy microsensor performance.

Typically, in harsh media pressure sensor applications, the microsensor device is isolated from the harsh media using metal diaphragm/silicone oil transfer media techniques. This approach has several disadvantages including high cost, lower sensitivity, and impaired performance over temperature extremes. Other approaches include coating the pressure sensor device and the package containing the device with a conformal organic coating such as a polyparaxylylene coating (e.g., Parylene®). This approach has a disadvantage because organic coatings are limited as to the media conditions (e.g., composition, time, temperature extremes, pressure extremes) that a manufacturer can expose them to without damaging the underlying microsensor device.

As is readily apparent, structures and methods are needed for protecting microsensor devices from harsh media that can withstand a wide variety of media conditions, that are cost effective, and that have improved reliability.

DETAILED DESCRIPTION OF THE DRAWINGS

In general, the present invention relates to microsensor structures and methods for sensing an environmental condition or conditions (e.g., temperature, concentration, pressure, etc.) in a harsh media. In particular, the present invention relates to media compatible microsensor structures having inorganic protective films covering portions of the structures that will be exposed to the harsh media. One can more fully understand the present invention with reference to FIGS. 1 to 5 together with the following detailed description.

Figure 1:
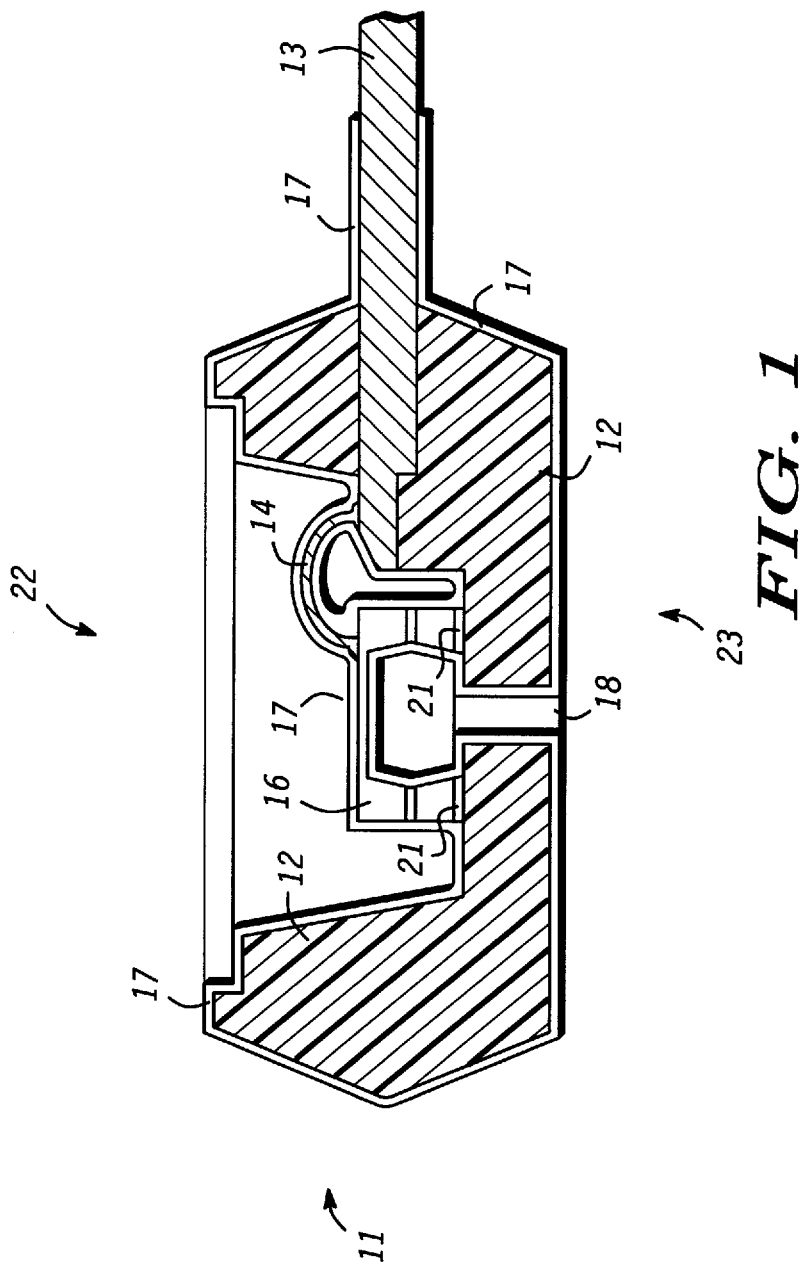
FIG. 1 illustrates an enlarged cross-sectional view of a media compatible microsensor structure according to the present invention.

FIG. 1 illustrates an enlarged cross-sectional view of a media compatible microsensor structure 11 according to the present invention. By way of example only, microsensor structure 11 is shown as a pressure sensor structure (e.g., a piezoresistive pressure sensor device). However, one skilled in the art will appreciate that the present invention pertains to microsensor devices in general. Microsensor structure 11 includes a microsensor package or housing 12, a leadframe 13, a connective wire 14, a microsensor device 16 coupled to microsensor package 12, and an inorganic protective coating or film 17.

Inorganic protective coating 17 covers those surfaces of microsensor package 12, leadframe 13, connective wire 14, and microsensor device 16 that will be exposed to a harsh media when microsensor structure 11 is placed in contact with the harsh media. In other words, inorganic protective coating 17 protects those portions of microsensor structure 11 that will be exposed to the harsh media. Typically, only a portion of leadframe 13 is covered so that leadframe 13 can effectively connect to monitoring and power supply equipment.

Microsensor structure 11 is shown with inorganic protective coating 17 covering most of the outer surfaces of the structure. Depending on the application, inorganic protective coating 17 will cover only a portion of the outer surfaces. For example, in applications where upper surfaces 22 of microsensor structure 11 will be exposed to the harsh media, only upper surfaces 22 require coverage with inorganic protective coating 17. Likewise, in applications where lower surfaces 23 will be exposed to the harsh media, only lower surfaces 23 require coverage. Where both upper surfaces 22 and lower surfaces 23 will be exposed to the harsh media, inorganic protective coating 17 preferably covers both upper surfaces 22 and lower surfaces 23.

Together, leadframe 13 and connective wire 14 are an example of a conductive structure for carrying signals to and from microsensor device 16. Other examples include flip chip, bump, and tape automated bonding (TAB) structures. In the embodiment shown in FIG. 1, leadframe 13 is integrally molded into a portion of microsensor package 12. Microsensor structure 11 typically includes several connective wires and leads depending on the level of electronic circuitry on microsensor device 16.

Typically, microsensor package 12 comprises a metal, plastic, or composite material. The material selected for microsensor package 12 depends on the specific application, the media composition, and cost constraints. In pressure sensor applications, microsensor package 12 typically comprises a high temperature or engineering thermoplastic, polyester, nylon, or an epoxy molding compound such as an unfilled epoxy or a silica filled epoxy. Such materials are well known in the art. Microsensor package 12 is shown with an aperture or hole 18 to provide access to one side of microsensor device 16 for use in differential pressure applications.

Microsensor device 16 typically comprises a semiconductor material and is coupled or bonded to microsensor package 12 using, for example, bonding layer 21. Bonding layer 21 comprises a lead glass, a soft solder (e.g., a Pb/Sn solder), an epoxy, or a silicone. Leadframe 13 typically comprises copper, a copper alloy, or a nickel alloy (e.g., alloy 42, kovar, or invar). Optionally, leadframe 13 includes a selectively plated metal layer (e.g., gold). Connective wire 14 comprises, for example gold or aluminum. These materials, and methods of assembly using such materials, are well known in the art.

Inorganic protective coating 17 comprises an inorganic material that is substantially non-reactive (i.e., reacts at a negligible rate) with the media that microsensor structure 11 is exposed to. Inorganic protective coating 17 preferably comprises an inorganic dielectric material such as a silicon oxide, a silicon oxy-nitride, a silicon nitride, a silicon carbide, a silicon oxy-carbide, or combinations thereof. The material selected for inorganic protective coating 17 depends on the media conditions (e.g., composition, duration of exposure, temperature extremes, and pressure extremes) in which microsensor structure 11 will be exposed to.

For example, when microsensor structure 11 is exposed to an alkaline environment (e.g., blood, sea water, detergents, bleach, or sodium hydroxide (NaOH)), inorganic protective coating 17 preferably comprises silicon nitride or silicon carbide. In polar solvent environments (e.g., ethanol, methanol), non-polar solvent environments (e.g., toluene, iso-octane), or acidic environments (e.g., sulfuric, nitric), inorganic protective coating 17 comprises any of the above listed inorganic materials.

In the embodiment shown in FIG. 1, inorganic protective coating 17 is formed after microsensor device 16 is bonded to microsensor package 12 and connective wire 14 is bonded to microsensor device 16 and leadframe 13. In other words, inorganic protective coating 17 is formed at a package level. At this point in the process, temperature considerations are important because elevated temperatures detrimentally impact the package and bonding materials.

Preferably, when inorganic protective coating 17 is formed at the package level, a low temperature (less than 200° C.) plasma enhanced chemical vapor deposition (PECVD) process is used. Preferably, inorganic protective coating 17 is formed using a room temperature PECVD process. Such a process is done, for example, in commercially available PECVD equipment (e.g., an Ionic Systems ColdCoat™ reactor available from Ionic Systems of Salinas, Calif.). The room temperature process is preferred because it avoids exposing the bonding and packaging materials to elevated temperatures. Also, it allows a manufacturer to fully coat the device in one process. In addition, the room temperature PECVD deposited films have low stress. Alternatively, inorganic protective coating 17 is formed using ion plating, ion assisted evaporation, or ion assisted sputtering techniques. Such techniques are well known in the art.

The thickness of inorganic protective coating 17 depends on the material used for inorganic protective coating 17 and the nature of the harsh media (e.g., composition, duration of exposure, temperature extremes, pressure extremes). Typically, inorganic protective coating 17 has a thickness in a range from approximately 1,000 to 10,000 angstroms when inorganic protective coating 17 comprises silicon nitride. When inorganic protective coating 17 comprises silicon nitride, connective wire 14 preferably comprises aluminum to provide good adhesion between the materials.

When microsensor device 16 comprises a piezoresistive pressure sensor, the addition of inorganic protective coating 17 can impact the output characteristics of the pressure sensor device. That is, the pressure sensor device may require adjustment to compensate for the presence of the additional layer or layers on the sensing element. Adjustment is done either before or after inorganic protective coating 17 is formed using well known laser trimming techniques of trim resistors present on the pressure sensor device. Preferably, trimming follows the formation of inorganic protective coating 17. This is easily achieved knowing the index of refraction and absorption coefficient of the inorganic material and adjusting the laser accordingly so that the laser energy is absorbed by the resistor material and not inorganic protective coating 17.

The embodiment shown in FIG. 1 has several advantages over prior art microsensor structures having organic protective coatings or metal diaphragms. First, inorganic protective coatings provide significantly improved barrier characteristics than organic coatings (i.e., they have much lower permeability). Also, because the inorganic coatings have improved barrier characteristics compared to organic coatings, thinner coatings are possible thus minimizing the impact on microsensor device characteristics. In addition, an inorganic protective coating allows a manufacturer to place the microsensor device in a greater variety of media. Furthermore, because microsensor structure 11 uses proven and existing processing techniques, microsensor structure 11 provides a cost effective, reliable alternative to metal diaphragm structures.

Figure 2:
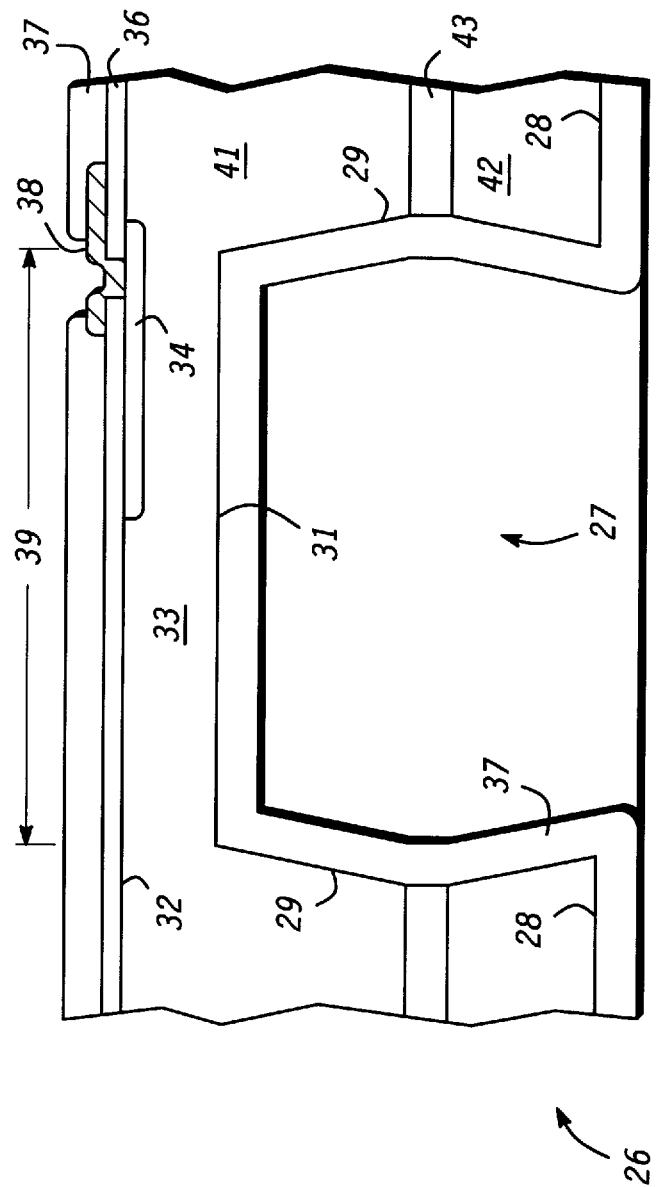
FIG. 2 illustrates an enlarged cross-sectional view of an embodiment of a microsensor device according to the present invention.

FIG. 2 illustrates an enlarged cross-sectional view of an embodiment of a microsensor or pressure sensor device 26 according to the present invention. Pressure sensor device 26 typically comprises a semiconductor material (e.g., silicon) and includes a cavity 27 that extends from a first major or lower surface 28 of pressure sensor device 26. Cavity 27 comprises sidewalls 29 and an upper surface 31. Upper surface 31 and second major surface 32 form a diaphragm 33. Cavity 27 is formed using well known processing techniques. Diaphragm 33 has a length 39 across cavity 27 typically in a range from 0.7 to 2.9 millimeters. A transducer 34 (e.g., a piezoresistive structure) is formed contiguous with second major surface 32. Transducer 34 comprises, for example, a diffused strain gauge configuration. Such a configuration is well known in the art.

Typically, a portion of second major surface 32 is covered with a passivation layer 36 such as a silicon oxide. Passivation layer 36 typically has a thickness on the order of 1,000 to 5,000 angstroms. Ohmic layer 38 provides contact to transducer 34. Passivation layer 36 and ohmic layer 38 are formed using well known processing techniques.

In this embodiment, pressure sensor device 26 comprises a semiconductor material or die portion 41 and a constraint or support portion 42. Semiconductor material portion 41 and constraint portion 42 preferably comprise the same material (e.g., silicon). Semiconductor material portion 41 is bonded to constraint portion 42 using bonding layer 43. Typically, bonding layer 43 comprises a frit glass such as a low-melting-point inorganic oxide glass (e.g., lead oxide or boric oxide). Semiconductor material 41 is bonded to constraint portion 42 at temperatures preferably below 450° C. to avoid damaging any electronic circuitry present on pressure sensor device 26. Optionally, pressure sensor device 26 comprises semiconductor material portion 41 only.

To provide a media compatible microsensor, inorganic protective coating or film 37 is formed on sidewalls 29 and upper surface 31 of cavity 27. Inorganic protective coating 37 is formed after the formation of cavity 27 (e.g., after cavity 27 is etched. That is, inorganic protective coating 37 is formed at a wafer or chip level. Inorganic protective coating 37 preferably comprises the same inorganic dielectric materials as inorganic protective coating 17. Preferably, inorganic protective coating 37 is formed using low temperature (less than 450° C.) PECVD process techniques. Such process techniques are well known in the art. PECVD deposited films are preferred because they provide uniform coverage and they typically possess lower stress compared to other deposited or grown inorganic films.

In addition, because inorganic protective coating 37 is formed at a wafer level, inorganic protective coating 37 may also comprise a metal such as aluminum, gold, platinum, vanadium, tungsten, titanium, chrome, nickel, their silicides or combinations thereof. The metal or silicide selected depends on the composition of the harsh media. For example, in an alkaline media, inorganic protective coating 37 preferably comprises gold or platinum. When inorganic protective coating 37 comprises a metal, inorganic protective coating 37 preferably has a thickness in a range from 2,500 to 15,000 angstroms and is formed using well known sputtering or evaporation techniques.

Optionally, inorganic protective coating 37 also is formed on first major surface 28 and portions of passivation layer 36. When passivation layer 36 is not used, inorganic protective coating 37 is formed on portions of second major surface 32. In either embodiment, when inorganic protective coating 37 comprises an inorganic dielectric, it preferably does not cover all of ohmic layer 38 or other ohmic layers to avoid contact resistance or bonding problems with the connective wires. When inorganic protective coating 37 comprises a metal, inorganic protective coating 37 does not contact ohmic layer 38 to avoid shorting problems. Preferably, a dielectric interlayer is used to separate inorganic protective coating 37 from ohmic layer 38 and second major surface 32 when inorganic protective coating 37 comprises a metal or a silicide.

It is important for inorganic protective coating 37 to cover sidewalls 29 as well as upper surface 31 when cavity 27 is exposed to a media that etches the material that pressure sensor device 26 is made of. This is because pressure sensor sensitivity and linearity are determined by the thickness of diaphragm 33, length 39, and the location of transducer 34 with respect to the edge of diaphragm 33 and any changes in these factors can impact device performance. For moderate pressure ranges (10–700 kPa), the optimum location of transducer 34 is at the edge of diaphragm 33 because this is the maximum stress location with respect to diaphragm 33.

When pressure sensor device 26 comprises silicon and the media comprises an alkaline environment, significant silicon etching can occur. Silicon etches anisotropically in alkaline solutions and if left unprotected, the etching can result in both a thinning of diaphragm 33 and an increase in length 39. A thinning of diaphragm 33 degrades initial device sensitivity and linearity throughout exposure to alkaline media. Also, an increase in length 39 changes both the diaphragm length and the relative location of the transducer, which also degrades the sensitivity and linearity.

For example, in an alkaline solution with a pH of 13, length 39 can change by 42 microns in 100 hours of exposure, which is a 1–4% change depending on the size of length 39 in typical pressure sensor devices. In some pressure sensor designs, this change results in a 7% loss in sensitivity and a 57% increase in linearity error after 360 hours of exposure at a pH of 13 and a temperature of 85° C. The presence of inorganic protective coating 37 on upper surface 31 and sidewalls 29 prevents such degradation.

In absolute pressure applications, constraint portion 42 is a continuous portion. That is, constraint portion 42 seals cavity 27. In an absolute pressure application, the package level approach is preferred because constraint portion 42 isolates or buffers diaphragm 33 and sidewalls 29 from the harsh media.

Figure 3:
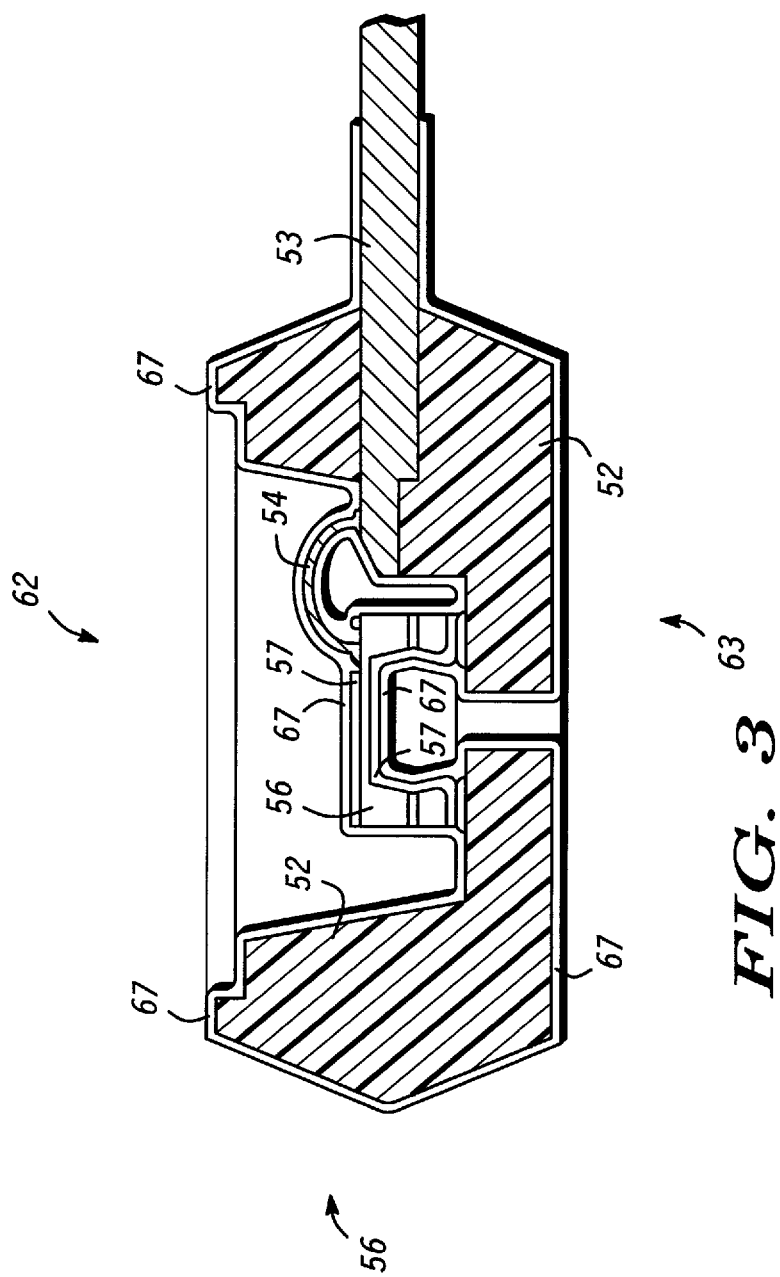
FIG. 3 illustrates an enlarged cross-sectional view of another embodiment of a media compatible microsensor structure according to the present invention.

FIG. 3 illustrates an enlarged cross-sectional view of another embodiment of a media compatible microsensor structure 51 according to the present invention. Microsensor structure 51 is similar to microsensor structure 11 except for microsensor device 56. Like microsensor device 26, microsensor device 56 includes a first inorganic protective film or coating 57 covering portions of the device. Microsensor structure 51 further comprises a second or additional inorganic protective coating 67 that covers exposed or outer surfaces of microsensor structure 51. Depending on the application, second inorganic protective coating 67 covers exposed portions of microsensor package 52, the upper and side surfaces of microsensor device 56, a portion of leadframe 53 and connective wire 54, and/or the lower surfaces of microsensor device 56.

Preferably, second inorganic protective coating 67 comprises an inorganic dielectric material such as a silicon oxide, a silicon oxy-nitride, a silicon nitride, a silicon carbide, or a silicon oxy-carbide. The material selected depends on the media conditions that microsensor structure 51 is exposed to. First inorganic protective coating 57 and second inorganic protective coating 67 are the same or different materials. Second inorganic protective coating 67 is formed using, for example, the same techniques as inorganic protective coating 17.

Figure 4:
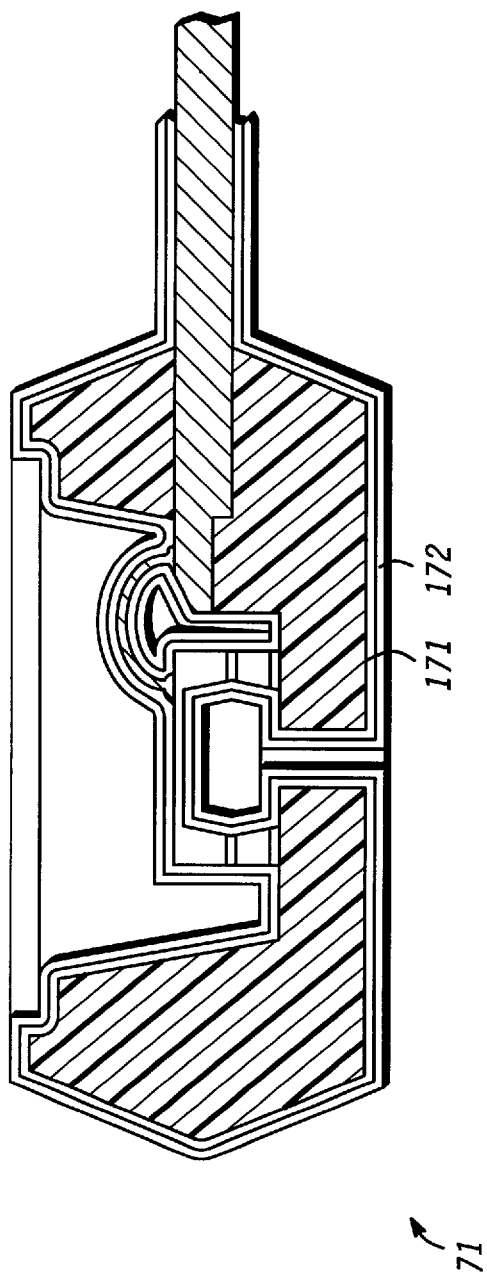
FIG. 4 illustrates an enlarged cross-sectional view of an additional embodiment of a media compatible microsensor structure according to the present invention.

FIG. 4 illustrates an enlarged cross-sectional view of an additional embodiment of a media compatible microsensor structure 71. Microsensor structure 71 is similar to microsensor structure 11 except that microsensor structure 71 includes first protective coating 171 underneath a second protective coating 172. In one embodiment, first protective coating 171 comprises an organic protective coating such as a polyparaxylylene coating (e.g., Parylene®) and is deposited using well known low temperature processing techniques. In this embodiment, second protective coating 172 comprises an inorganic protective coating such as a silicon oxide, a silicon oxy-nitride, a silicon nitride, a silicon carbide, a silicon oxy-carbide, or combinations thereof. In addition, second protective coating 172, may comprise aluminum, gold, platinum, vanadium, tungsten, titanium, chrome, nickel, their silicides, or combinations thereof. Preferably, inorganic protective coating 172 comprises a material having a thermal coefficient of expansion (TCE) close to that of the underlying materials.

In an alternative embodiment, first protective coating 171 comprises an inorganic protective coating such as a silicon oxide, a silicon oxy-nitride, a silicon nitride, a silicon carbide, or a silicon oxy-carbide. In this alternative embodiment, second protective coating 172 comprises an organic protective coating such as a polyparaxylylene coating (e.g., Parylene®). The combination of inorganic and organic protective coatings provides a microsensor structure capable of withstanding exposure to a wide variety of media.

Figure 5:
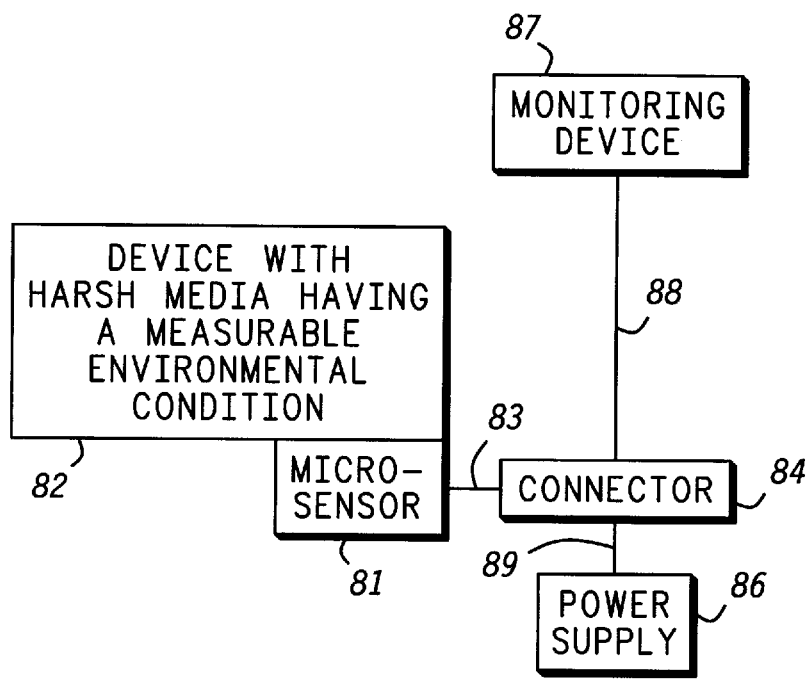
FIG. 5 illustrates a block-diagram that represents an apparatus for using a microsensor structure according to the present invention.

FIG. 5 illustrates a block-diagram that represents an apparatus 80 for using a microsensor structure according to the present invention to sense an environmental condition in a harsh media. Apparatus 80 includes a device 82 containing a harsh media having a measurable environmental condition. For example, device 82 comprises a storage vessel containing a harsh media (e.g., polar solvent, non-polar solvent, alkaline solution, acid, etc.) or a pump pumping a harsh media. A media compatible microsensor structure 81 is coupled to device 82 to sense an environmental condition such as liquid level within the storage vessel or pressure within a supply line from the pump.

To measure the environmental condition, microsensor structure 81 comprises, for example, microsensor structure 11, 51, or 71 shown in FIGS. 1, 3, and 4 respectively. To protect it against the harsh media, at least those surfaces of microsensor structure 81 that are exposed to the harsh media are covered with an inorganic protective coating. Input and output signals to and from microsensor structure 81 are controlled and monitored using power supply device 86 and output or monitoring device 87 (e.g., a multimeter). Monitoring device 87 optionally includes a display monitor and/or storage means. Power supply device 86 and monitoring device 87 are coupled to microsensor structure 81 through cables 88 and 89, connector 84, and conductive structure 83. Such devices, cables, and connectors are well known in the art.

Monitoring device 87 optionally provides an output signal or signals in response to a sensed environmental condition as a process control means. For example, when device 82 comprises a fuel storage tank in a vehicle and the liquid level reaches a certain amount, monitoring device 87 sends a signal to a dashboard light to warn the driver of a diminishing fuel supply. Alternatively, when device 82 comprises a pump and microsensor structure 81 senses a certain pressure in the supply line from the pump, monitoring device 87 provides an output signal to the pump to increase or decrease its delivery.

By now it should be appreciated that cost effective structures and methods have been provided for measuring an environmental condition in harsh media. By incorporating an inorganic protective coating at either wafer or package level, a significant improvement in barrier characteristics is achieved compared prior art organic protective coatings. This improves reliability. Also, the structure achieves a media compatible microsensor without using metal diaphragm/transfer media techniques, which saves on cost and improves performance over temperature extremes.

We claim:

1. A microsensor having an inorganic protective film comprising:
    a pressure sensor device including a cavity extending from a first major surface, the cavity having a plurality of sidewalls and an upper surface that forms a diaphragm with a second major surface of the pressure sensor device, a transducer formed contiguous with the second major surface, and a first inorganic protective film formed on the plurality of sidewalls and the upper surface of the cavity;
    packaging means for supporting the pressure sensor device, the pressure sensor device coupled to the packaging means; and
    conductive means for transporting signals to and from the pressure sensor device, the conductive means coupled to the pressure sensor device.

2. A microsensor according to claim 1 wherein the pressure sensor device comprises silicon.

3. A microsensor according to claim 1 wherein the first inorganic protective film is selected from a group consisting of a silicon oxide, a silicon oxy-nitride, a silicon nitride, a silicon carbide, and a silicon oxy-carbide.

4. A microsensor according to claim 1 wherein the first inorganic protective film comprises a metal.

5. A microsensor according to claim 1 further comprising a second inorganic protective film formed on exposed portions of the packaging means, the pressure sensor device, and a portion of the conductive means.

6. The microsensor according to claim 5 further comprising an organic protective coating underneath the second inorganic protective coating.

7. The microsensor according to claim 5 further comprising an organic protective coating formed over the second inorganic protective coating.

8. A method for forming a microsensor having an inorganic protective film comprising the steps of:
    providing a pressure sensor device including a cavity extending from a first major surface, the cavity having a sidewall and an upper surface that forms a diaphragm with a second major surface of the pressure sensor device, a transducer formed contiguous with the second major surface;
    forming a first inorganic protective film on the sidewalls and the upper surface of the cavity;
    coupling the pressure sensor device to a packaging means for supporting the pressure sensor device; and
    coupling conductive means for transporting signals to and from the pressure sensor device to the pressure sensor device.

9. The method of claim 2 wherein the step of providing the pressure sensor includes providing a silicon pressure sensor device.

10. The method of claim 8 wherein the step of forming the first inorganic protective film includes forming the first inorganic film comprising a material selected from a group consisting of a silicon oxide, a silicon oxy-nitride, a silicon nitride, a silicon carbide, and a silicon oxy-carbide.

11. The method of claim 8 wherein the step of forming the first inorganic protective film includes forming the first inorganic protective film comprising a metal.

12. The method of claim 8 further comprising the step of forming a second inorganic protective film on exposed portions of the packaging means, the pressure sensor device, and a portion of the conductive means.

13. The method of claim 12 further comprising the step of forming an organic protective coating on exposed portions of the packaging means, the pressure sensor device, and a portion of the conductive means before the step of forming the second inorganic protective film.

14. The method of claim 12 further comprising the step of forming an organic protective coating over the second inorganic protective coating.

* * * * *

UNITED STATES PATENT AND TRADEMARK OFFICE
CERTIFICATE OF CORRECTION

PATENT NO. : 5,889,211
DATED : March 30, 1999
INVENTOR(S) : Theresa A. Maudie et al.

It is certified that error appears in the above-identified patent and that said Letters Patent is hereby corrected as shown below:

Column 8,
Line 25, delete "sidewalls" and add -- sidewall --.
Line 32, delete "2" and add -- 8 --.

Signed and Sealed this

Twenty-eighth Day of June, 2005

JON W. DUDAS
*Director of the United States Patent and Trademark Office*